(12) United States Patent
Chang et al.

(10) Patent No.: US 7,797,668 B2
(45) Date of Patent: Sep. 14, 2010

(54) METHOD FOR OPTIMALLY CONVERTING A CIRCUIT DESIGN INTO A SEMICONDUCTOR DEVICE

(75) Inventors: Gwan Sin Chang, Hsinchu (TW);
Ru-Gun Liu, Hsinchu (TW);
Chih-Ming Lai, Hsinchu (TW);
Yung-Chin Hou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 434 days.

(21) Appl. No.: 11/333,925

(22) Filed: Jan. 18, 2006

(65) Prior Publication Data

US 2007/0006117 A1 Jan. 4, 2007

Related U.S. Application Data

(60) Provisional application No. 60/695,390, filed on Jun. 30, 2005.

(51) Int. Cl.
*G06F 17/50* (2006.01)
*G06F 9/45* (2006.01)

(52) U.S. Cl. .............. 716/21; 716/4; 716/5; 716/6; 716/11; 716/19; 703/14

(58) Field of Classification Search .......... 716/4, 716/6, 19, 21
See application file for complete search history.

(56) References Cited

U.S. PATENT DOCUMENTS

| | | | | |
|---|---|---|---|---|
| 6,782,525 B2* | 8/2004 | Garza et al. | ............ | 716/19 |
| 6,915,252 B1* | 7/2005 | Li | ............ | 703/22 |
| 7,000,205 B2* | 2/2006 | Devgan et al. | ............ | 716/6 |
| 7,135,344 B2* | 11/2006 | Nehmadi et al. | ............ | 438/14 |
| 7,188,327 B2* | 3/2007 | Hahn | ............ | 716/6 |
| 7,206,731 B2* | 4/2007 | Sercu et al. | ............ | 703/14 |
| 7,251,793 B1* | 7/2007 | Steffan | ............ | 716/4 |
| 7,295,304 B2* | 11/2007 | Yamaguchi et al. | ............ | 356/237.5 |
| 7,302,672 B2* | 11/2007 | Pack et al. | ............ | 716/19 |
| 7,340,698 B1* | 3/2008 | Srinivasan et al. | ............ | 716/4 |
| 7,383,521 B2* | 6/2008 | Smith et al. | ............ | 716/6 |
| 2003/0196182 A1* | 10/2003 | Hahn | ............ | 716/6 |
| 2005/0251771 A1* | 11/2005 | Robles | ............ | 716/5 |
| 2006/0199083 A1* | 9/2006 | Sinha et al. | ............ | 430/5 |
| 2006/0265679 A1* | 11/2006 | Scheffer et al. | ............ | 716/8 |
| 2007/0094626 A1* | 4/2007 | Alter et al. | ............ | 716/6 |
| 2008/0072208 A1* | 3/2008 | Yamaguchi et al. | ............ | 716/21 |

* cited by examiner

*Primary Examiner*—Helen Rossoshek
(74) *Attorney, Agent, or Firm*—K&L Gates LLP

(57) ABSTRACT

A method for converting a circuit design into a semiconductor device includes the following steps. A first set of deign information is provided for representing the circuit design. Priority design information, which represents a priority portion of the circuit design, is extracted from the first set of design information. The priority design information is processed for generating a second set of design information. The semiconductor device is fabricated based on the first and second sets of design information. The second set of design information contains enhanced fabrication conditions as opposed to those of the first set of design information for optimizing the conversion of the circuit design into the semiconductor device.

13 Claims, 6 Drawing Sheets

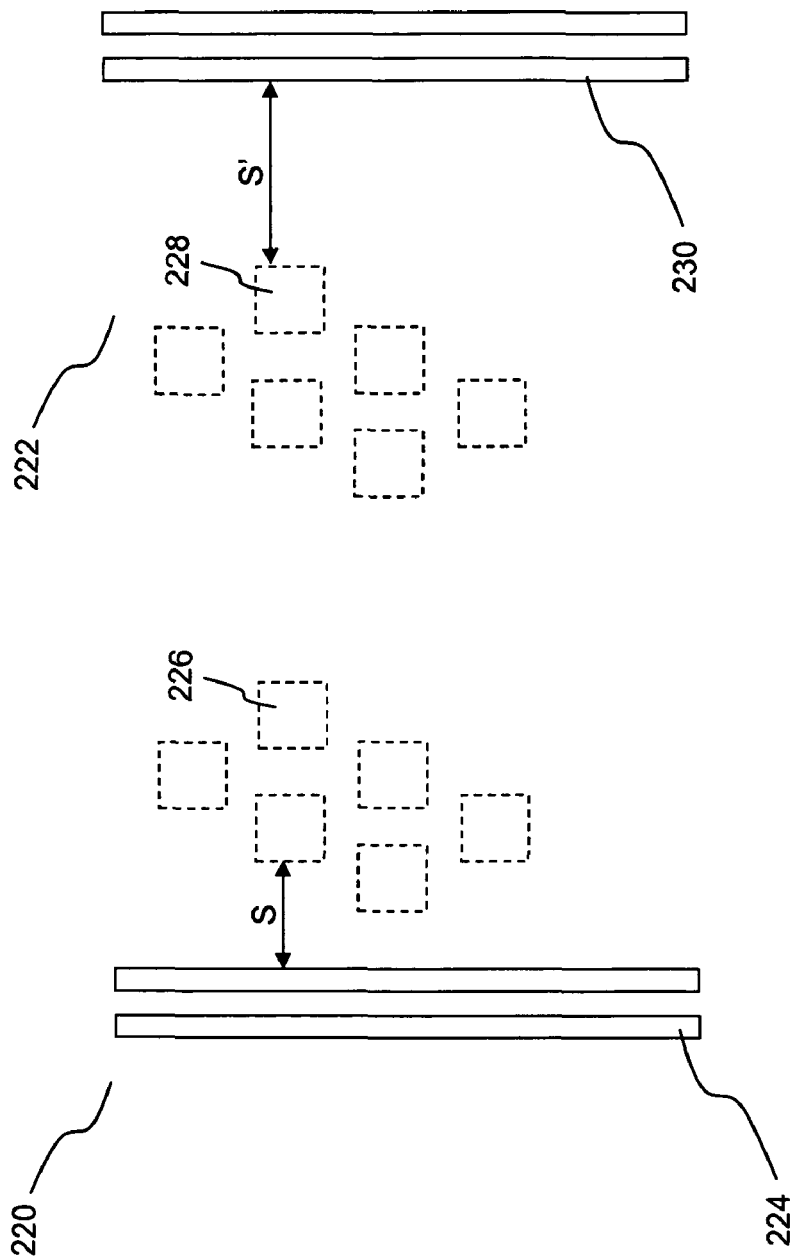

US 7,797,668 B2

METHOD FOR OPTIMALLY CONVERTING A CIRCUIT DESIGN INTO A SEMICONDUCTOR DEVICE

BACKGROUND

The present invention claims priority to U.S. Provisional Application No. 60/695,390 filed Jun. 30, 2005 entitled "Information for Connecting VLSI Design and Manufacturing/Critical Net Extraction for VLSI Design and Manufacturing".

The present invention relates generally to an integrated circuit (IC) design, and more particularly to a method for optimally converting a circuit design into a semiconductor device.

New IC creation is an extremely time-consuming, labor-intensive, and costly endeavor. The IC creation process can be divided into the IC design/verification stage and the IC fabrication/test stage. The circuit design houses produce circuit designs according to certain predefined specifications. The semiconductor foundries then receive the circuit designs from the design houses and convert them into semiconductor devices using their proprietary intellectual properties or technical library. The circuit design houses include, for example, fabless companies and circuit design organization of integrated device manufacturers (IDMs). The fabless companies do not have their own company plants to manufacture their ICs design, while the IDMs have their own company plants. The IDMs may manufacture their IC designs within their own company plants or through outside pure semiconductor foundry house. The fabless companies have to entrust the pure semiconductor foundry houses with their IC designs for manufacturing semiconductor devices.

While a circuit design may include various kinds of components connected by a plurality of conductive lines, not all of the components are of equal importance. For example, a device may be placed in an area where the accuracy of signal timing is crucial to the entire circuit, whereas another device may be placed in an area that requires less accurate signal timing. Traditionally, the design information received by the foundry from the design house does not differentiate the crucial components from the non-crucial ones. As such, the foundry applies the same set of fabrication conditions in manufacturing comparable parts of the crucial and non-crucial components.

One drawback of the conventional approach to converting the circuit design into the semiconductor device is its inefficiency. Conventionally, both the crucial and non-crucial portions of the circuit design are manufactured using the same fabrication conditions. On the one hand, such fabrication conditions may not be able to provide the crucial portion implemented in the semiconductor device with desired electronic characteristics. On the other hand, they may waste valuable resources in fabricating the non-crucial portion, which has a relatively low quality requirement. The conventional approach is not an optimal method for converting the circuit design into the semiconductor, thereby rendering the conversion inefficient.

Thus, it is desirable to devise new methods for optimizing the process of converting the circuit design into the semiconductor device.

SUMMARY

The present invention provides a method for converting a circuit design into a semiconductor device. In one embodiment of the present invention, the method includes the following steps. A first set of deign information is provided for representing the circuit design. Priority design information, which represents a priority portion of the circuit design, is extracted from the first set of design information. The priority design information is processed for generating a second set of design information. The semiconductor device is fabricated based on the first and second sets of design information. The second set of design information contains enhanced fabrication conditions as opposed to those of the first set of design information for optimizing the conversion of the circuit design into the semiconductor device.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIG. 2C illustrates various dummy pattern insertion schemes for priority and non-priority portions of the circuit design in accordance with one embodiment of the present invention.

DESCRIPTION

Figure 1:
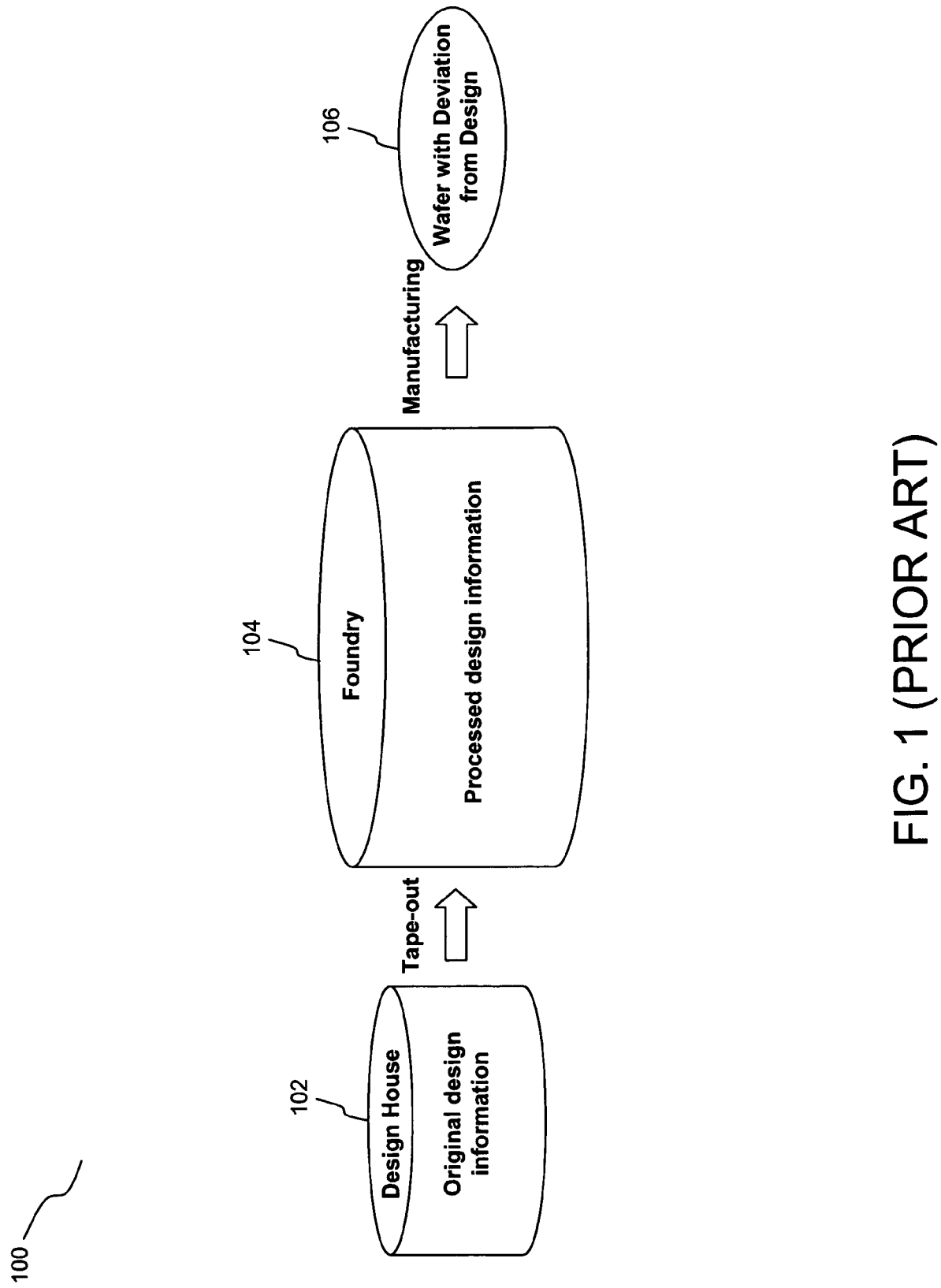
FIG. 1 illustrates a conventional process flow for converting a circuit design into a semiconductor device.

FIG. 1 illustrates a conventional process flow 100 for converting a circuit design into a semiconductor device in the semiconductor industry. The design house 102 (fabless company or IDM) synthesizes the circuit design into a high level software language to generate the original design information. The original design information can be configured in a textual, graphical or logic symbol format. After the original design information is verified, the design house 102 delivers the original information to the foundry 104 for converting the circuit design into the semiconductor device.

The semiconductor foundry (or maker) 104 needs to process the original design information, before it can be loaded to process equipment for manufacturing. For example, the foundry house would typically insert one or more dummy patterns in the layout of the circuit design, or perform process bias, optical proximity correction (OPC) and e-beam writing. The processed design information is then loaded to equipment for producing wafers that contain a plurality of dies each of which represents the physical implementation of the circuit design. The die will then be packaged as the semiconductor device.

As discussed above, while the circuit design may have a priority portion and a non-priority portion, the foundry would apply the same fabrication conditions for both of them. For the priority portion, the fabrication conditions may not be sufficient to meet its specification requirements, thereby causing the semiconductor device deviating from its desired functionality or quality. For the non-priority portion, the fabrication conditions may be more elaborate than what it really needs, thereby wasting the manufacturing resources. Thus, the conventional process flow is inefficient and needs to be improved.

Figure 2A:
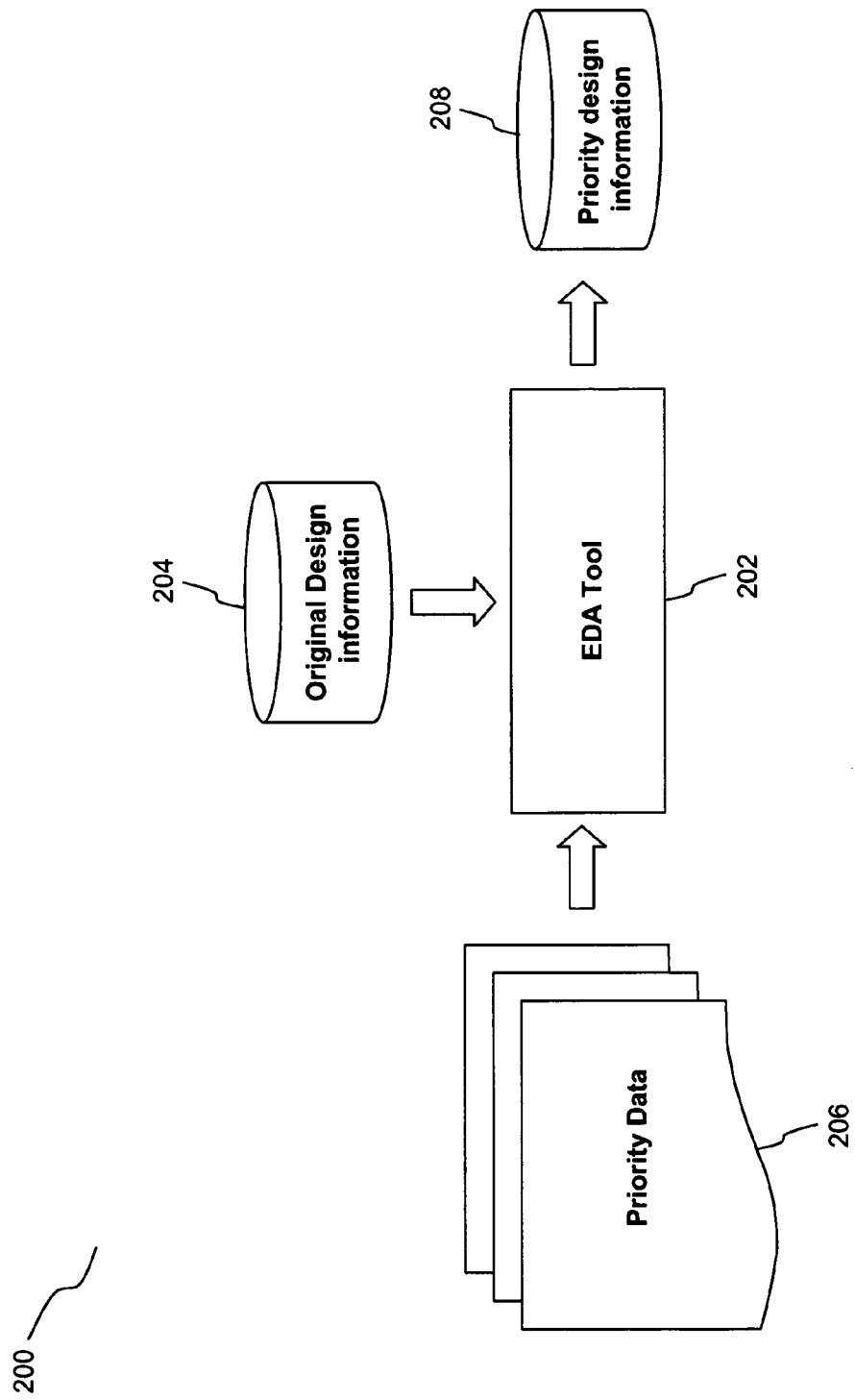
FIG. 2A illustrates a proposed process flow for extracting priority design information from original design information in accordance with one embodiment of the present invention.

FIG. 2A illustrates a proposed process flow for converting the circuit design into the semiconductor device in accordance with one embodiment of the present invention. The embodiment details a scheme that treats the priority portion and the non-priority portion differently in order for improving reliability of the semiconductor device and the efficiency of its fabrication process.

The original design information 204 is provided by a fabless company or IDM for representing the circuit design. The priority portion can also be provided by a fabless company or IDM. The priority portion is then identified from the circuit design, and configured as the priority data 206, which can be in a textual, graphic, and logic symbol format. For example, the priority data 206 can be a set of critical net information identified from a netlist representing the circuit design. The priority portion of the circuit design can be any circuit modules, active devices, passive devices, components, connections and area of higher specification requirements. For example, it includes, but not limited to, MOS transistors, analog devices, digital devices, radio frequency (RF) devices, mixed-mode circuits, resistors, capacitors and inductors, and interconnections, vias, conductive lines, spaces, and regions defined by horizontal and vertical coordinates.

An electronic design automation (EDA) tool 202 is used to extract priority design information 208 from the original design information 204 based on the priority data 206. The commercial EDA tool 202 can be a design-rule check (DRC) engine, layout vs. schematic (LVS) verification tool, layout editor, OPC tool, timing analyzer, simulation program with integrated circuit emphasis (SPICE) simulation tool, design for manufacturability (DFM) oriented stand-alone tool and automatic place and route (APR) tool. The original design information 204 and the priority design information 208 can be configured in a textual, graphical and logic symbol format. For example, they can be configured in a (graphic design system) GDS format that is typically used in the semiconductor industry. The priority design information 208 will be processed to contain enhanced fabrication conditions, depending on the specification requirements of the priority portion of the circuit design. The processed design information (not shown in the figure) and the original design information 204 will be used for fabricating the semiconductor device or making the masks or reticles for manufacturing the semiconductor device.

Figure 2B:
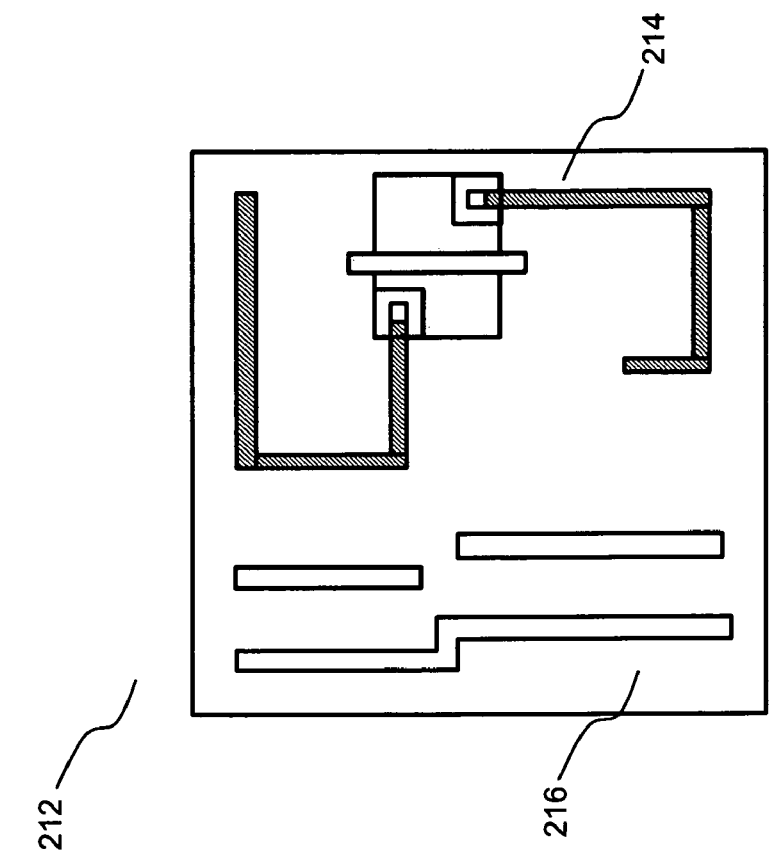
FIG. 2B illustrates circuit layouts for exemplifying extraction of the priority design information from the original design information of the circuit design in accordance with one embodiment of the present invention.
Figure 2B:
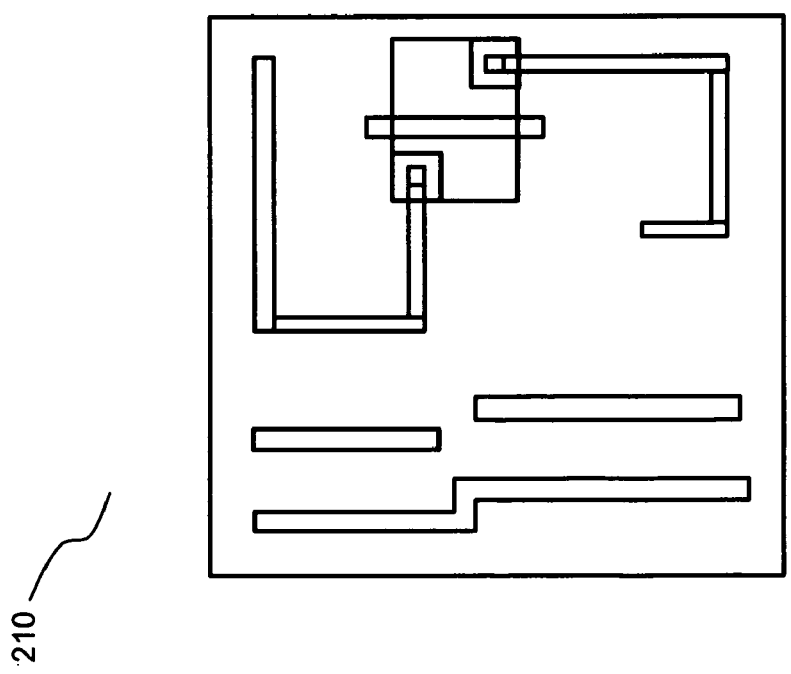

FIG. 2B illustrates extraction of priority design information from an original design information of the circuit design in accordance with one embodiment of the present invention. The diagram 210 shows a layout of the circuit design which has priority and non-priority portions mingled together. The diagram 212 shows the priority portion 214, which is drawn by solid lines, is extracted from the original layout shown by the diagram 210. The patterns drawn by the phantom lines demonstrate the non-priority portion 216 that is separated from the priority portion 214. The priority portion 214 is of crucial importance, and therefore is subject to a higher specification requirement in converting the circuit design into the semiconductor device.

FIG. 2C illustrates various dummy pattern insertion schemes for priority and non-priority portions of the circuit design in accordance with one embodiment of the present invention. The diagram 220 shows a number of dummy patterns 226 placed adjacent to a conductive line 224 within an non-priority portion, whereas the diagram 222 shows a number of dummy patterns 228 placed adjacent to a conductive line 230 within a priority portion. A parasitic capacitor would be induced between the conductive line 224 and the dummy patterns 226 and between the conductive line 230 and the dummy patterns 228, due to the coupling effect. The dummy patterns 226 and 228, which were not a part of the circuit design, are added into the circuit layout for improving a planarization process, such as chemical mechanical publishing (CMP) or plasma etching back, when the original design information and the priority design information are processed by the foundry. The conductive line 230 in the priority portion requires a better signal transmission quality, and therefore the dummy patterns 228 are placed farer from the conductive line 230 in order to reduce the capacitance of the induced parasitic capacitor. The conductive line 224 in the non-priority portion can tolerate a poorer signal transmission quality, and therefore the dummy patterns 226 can be placed closer to the conductive line 224 for purposes such as saving the layout area and preparing for a subsequent CMP process to provide a uniform polished profile. Thus, the arrangement of dummy patterns can be optimized.

Figure 2D:
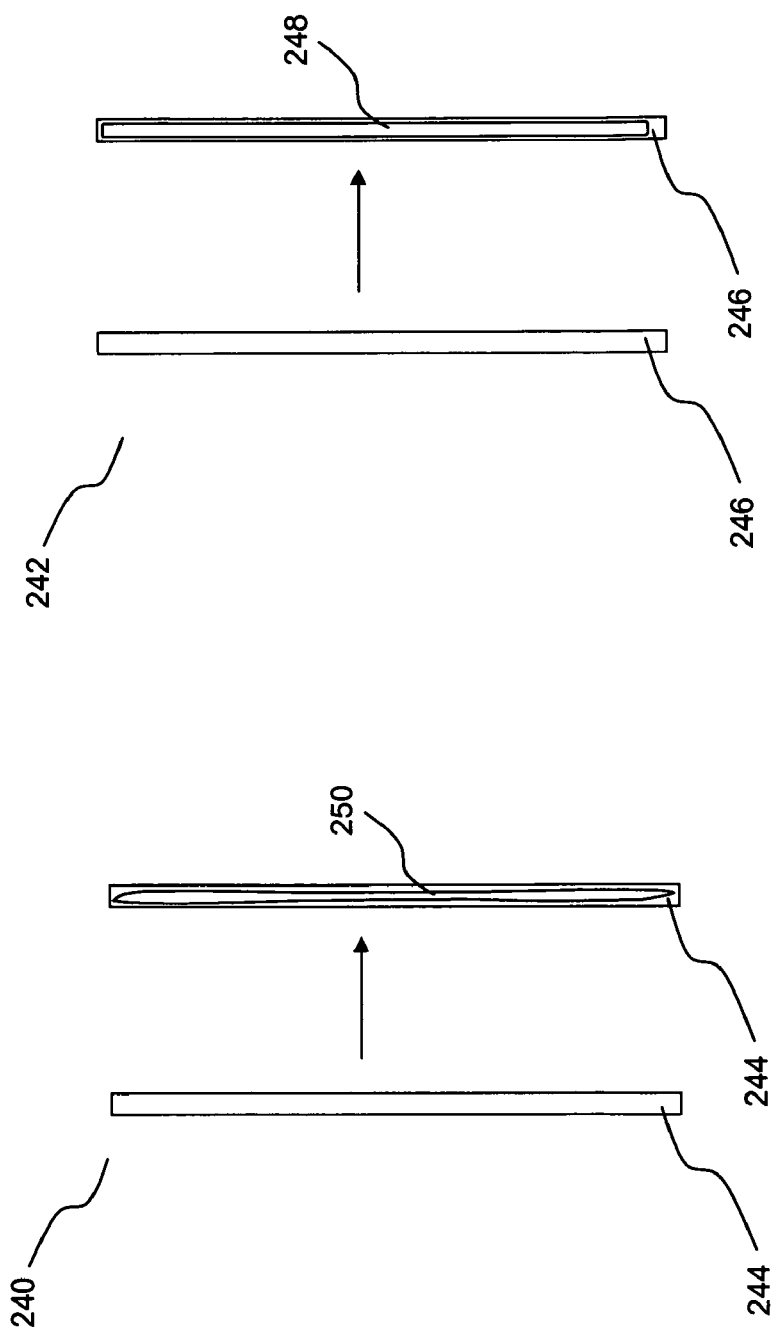
FIG. 2D illustrates a priority portion and a non-priority portion of the circuit design that are treated by different fabrication conditions in accordance with one embodiment of the present invention.

FIG. 2D illustrates a priority portion and a non-priority portion of the circuit design that are treated by different fabrication conditions in accordance with one embodiment of the present invention. The diagram 240 shows a conductive line 244 made of, for example, polysilicon within a non-priority portion, while the diagram 242 shows a conductive line 246 made of, for example, polysilicon within a priority portion. The fabrication conditions for the priority portion are enhanced as opposed to the non-priority portion. For example, the enhanced fabrication conditions help to form a better quality silicide layer 248 on the conductive line 246 in the priority portion, whereas the regular fabrication conditions forms a silicide layer 250 of poorer quality on the conductive line 244. The enhanced silicide layer 248 has better consistency between the shapes drawn in the design and those formed on the silicon, such that the device performance can be improved. Since the conductive line 244 tolerates less signal transmission quality, the silicide layer 250 can serve its purposes well while saving the fabrication costs. Thus, the differentiation of the fabrication conditions can balance the specification requirement and the fabrication costs.

It is noted that other fabrication process not shown in FIGS. 2C and 2D, such as OPC for masks and reticles, can be enhanced for the priority portions of the circuit designs in order to meet its higher specification requirements.

Figure 3:
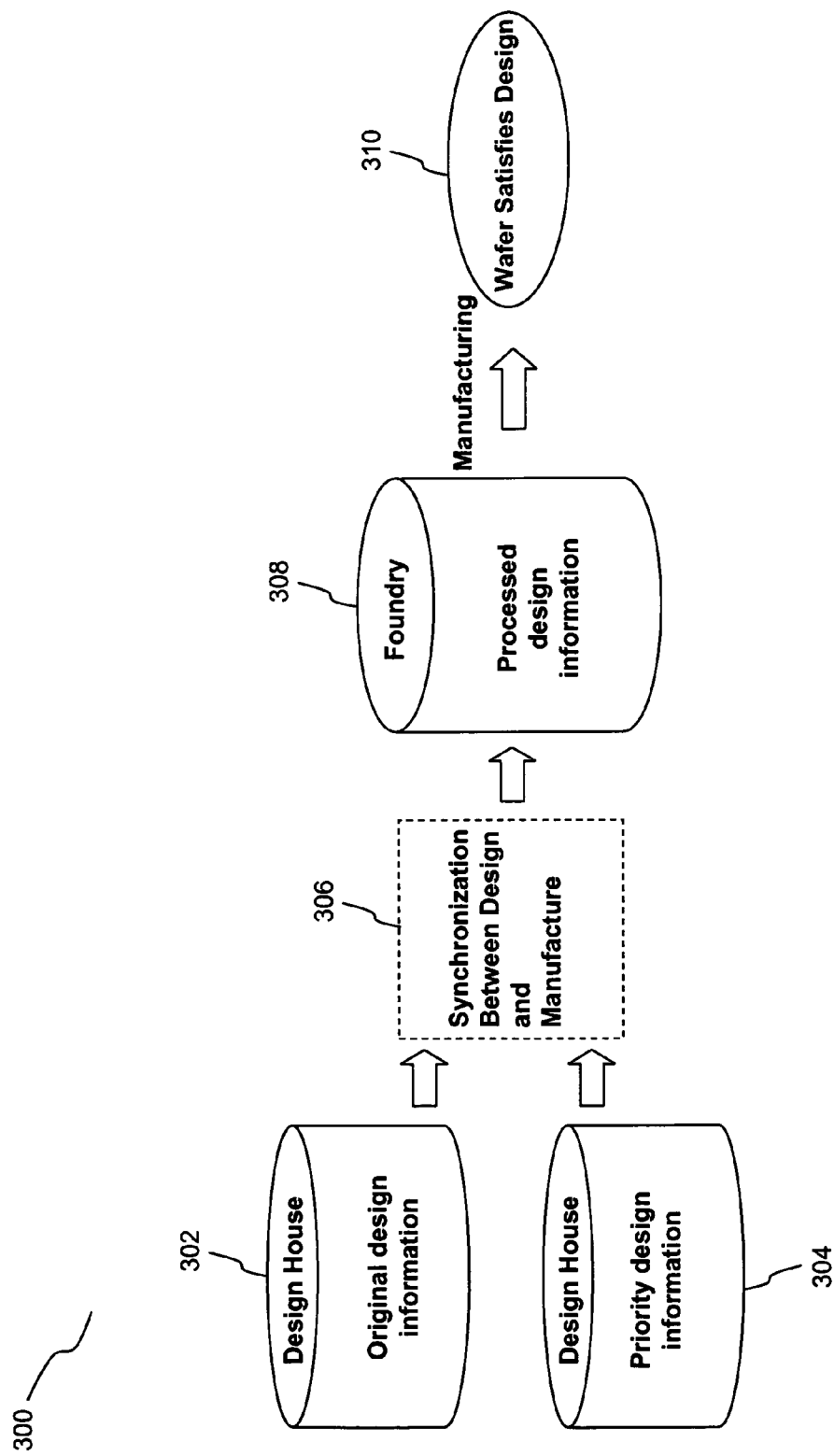
FIG. 3 illustrates a business module for converting the circuit design into the semiconductor device in accordance with one embodiment of the present invention.

FIG. 3 illustrates a business module 300 for foundries and design houses, including fabless companies and IDMs, in converting the circuit design into the semiconductor device in accordance with one embodiment of the present invention. In the embodiment, a design house provides the original design information 302 of the circuit design, and the priority design information 304 extracted from the original design information. The two sets of information 302 and 304 can be optionally synchronized between the design stage and the manufacturing stage. The foundry receives the two sets of information 302 and 304 from the design house, and processes them by applying enhanced fabrication conditions to the priority design information 304 and regular fabrication conditions to the original design information 302. The foundry uses the two sets of information 302 and 304 to produce wafers 310 or make a set of masks or reticles for producing the wafers 310. Each of the wafers 310 contains a plurality of dies each of which represents the physical implementation of the circuit design. The die will then be packaged as the semiconductor device.

The proposed invention optimizes the process of converting the circuit design into the semiconductor device, and improves a number of technical issues. For example, global timing delay caused by the improper dummy structure insertion and poor processing conditions for the priority portion can be eliminated by proper condition biasing. The spacing between proposed dummy metal depositions can also be optimized in areas where the spacing between the dummies for critical paths widens to reduce the parasitic capacitance and OPC cycle time while the dummies for non-critical paths are implemented with less spacing to save chip area. The proposed method can also improve the circuit quality by providing the priority portion with better fabrication treatments to achieve precise silicon profile and satisfy design requirements, while the non-priority portion is treated loosely to improve efficiency and save process cycle time without impacting the design specifications.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for converting a circuit design into a lithography mask to be used for fabricating a semiconductor device by an integrated circuit foundry, comprising:
    receiving an original design information representing the circuit design from a source entity other than the integrated circuit foundry;
    identifying priority portions and non-priority portions from the circuit design;
    configuring the priority portions as priority data, wherein the priority data include a set of critical net information identified from a netlist representing the circuit design;
    extracting a priority design information from the original design information based on the priority data, wherein the priority design information represents the priority portions of the circuit design;
    processing both the original design information and the priority design information by applying regular fabrication conditions to the original design information and enhanced fabrication conditions to the priority design information to generate a processed design information, wherein the step of processing is performed by the integrated circuit foundry using its proprietary intellectual properties or technical library; and
    producing the lithography mask using the processed design information for fabricating the semiconductor device with improved quality and reliability using the produced mask.

2. The method of claim 1, wherein the original design information or the processed design information is configured in a graphical, textual, or logic symbol format.

3. The method of claim 1, wherein the priority design information comprises one or more active devices including, but not limited to, MOS transistors, analog devices, digital devices, radio frequency (RF) devices and mixed-mode circuits.

4. The method of claim 1, wherein the priority design information comprises one or more passive devices including, but not limited to, resistors, capacitors and inductors.

5. The method of claim 1, wherein the priority design information comprises interconnections, vias, conductive lines, spaces, and regions defined by horizontal and vertical coordinates.

6. The method of claim 1, wherein the step of processing comprises performing optical proximity correction (OPC) on the mask corresponding to the priority portions of the circuit design represented by the priority design information.

7. The method of claim 1, wherein the step of processing comprises adjusting dummy pattern arrangement for the priority portions of the circuit design represented by the priority design information.

8. A method for converting a circuit design into a lithography mask to be used for fabricating a semiconductor device by an integrated circuit foundry, comprising:
    receiving an original design information representing the circuit design from a source entity other than the integrated circuit foundry, wherein the source entity includes a circuit design house;
    identifying priority portions and non-priority portions from the circuit design;
    configuring the priority portions as priority data, wherein the priority data include a set of critical net information identified from a netlist representing the circuit design;
    extracting a priority design information from the original design information based on the priority data using an electronic design automation tool, wherein the priority design information represents the priority portions of the circuit design;
    processing both the original design information and the priority design information by applying regular fabrication conditions to the original design information and enhanced fabrication conditions to the priority design information to generate a processed design information, wherein the steps of extracting and processing are performed by the integrated circuit foundry using its proprietary intellectual properties or technical library; and
    producing the lithography mask using the processed design information for fabricating the semiconductor device with improved quality and reliability using the produced lithography mask.

9. The method of claim 8, wherein the original circuit design information or the processed design information is configured in a graphical, textual, or logic symbol format.

10. The method of claim 8, wherein the priority design information comprises one or more active devices including, but not limited to, MOS transistors, analog devices, digital devices, radio frequency (RF) devices and mixed-mode circuits.

11. The method of claim 8, wherein the priority design information comprises one or more passive devices including, but not limited to, resistors, capacitors and inductors.

12. The method of claim 8, wherein the step of processing comprises performing optical proximity correction (OPC) on the mask corresponding to the priority portions of the circuit design represented by the priority design information.

13. The method of claim 8, wherein the step of processing comprises adjusting dummy pattern arrangement for the priority portions of the circuit design represented by the priority design information.

\* \* \* \* \*